United States Patent
Tweet et al.

(10) Patent No.: US 7,651,880 B2
(45) Date of Patent: Jan. 26, 2010

(54) GE SHORT WAVELENGTH INFRARED IMAGER

(75) Inventors: Douglas J. Tweet, Camas, WA (US); Jer-Shen Maa, Vancouver, WA (US); Jong-Jan Lee, Camas, WA (US); Sheng Teng Hsu, Camas, WA (US)

(73) Assignee: Sharp Laboratories of America, Inc., Camas, WA (US)

( * ) Notice: Subject to any disclaimer, the term of this patent is extended or adjusted under 35 U.S.C. 154(b) by 396 days.

(21) Appl. No.: 11/592,465

(22) Filed: Nov. 4, 2006

(65) Prior Publication Data
US 2008/0121805 A1 May 29, 2008

(51) Int. Cl.
*H01L 25/00* (2006.01)
(52) U.S. Cl. .................. 438/57; 250/332; 257/E31.011
(58) Field of Classification Search .................. 438/57, 438/495, 508, 64, 65, 66; 250/332
See application file for complete search history.

(56) References Cited

U.S. PATENT DOCUMENTS

| | | | |
|---|---|---|---|
| 6,537,370 B1 | 3/2003 | Hernandez et al. | 117/88 |
| 6,635,110 B1 | 10/2003 | Luan et al. | 117/4 |
| 6,645,831 B1 | 11/2003 | Shaheen et al. | 438/455 |
| 7,453,129 B2 * | 11/2008 | King et al. | 257/414 |
| 2006/0267054 A1 * | 11/2006 | Martin et al. | 257/291 |

OTHER PUBLICATIONS

S.B. Samavedam, M.T. Currie, T.A. Langdo, and E.A. Fitzgerald, "High-quality germanium photodiodes integrated on silicon substrates using optimized relaxed graded buffers", Applied Physics Letters, vol. 73, 2125 (1998).
J.L. Liu, Z. Yang, and K.L. Wang, "Sb surfactant-mediated SiGe graded layers for Ge photodiodes integrated on Si", J. Applied Phys. vol. 99, 024504 (2006).
L. Colace, G. Masini, F. Galluzzi, G. Assanto, G. Capellini, L. Di Gaspare, E. Palange, and F. Evangelisti, Appl. Phys. Lett. vol. 72, 3175 (1998).
H-C. Luan, D.R. Lim, K.K Lee, K.M Chen, J.G. Sandland, K. Wada, and L.C. Kimerling, "High-quality Ge epilayers on Si with low threading-dislocation densities", Appl Phys Lett, vol. 75, 2909 (1999).
L. Colace, G. Masini, G. Assanto, H-C. Luan, K. Wada, and L.C. Kimerling, "Efficient high-speed near-infrared Ge photodectors integrated on Si substrates", Appl Phys Lett., vol. 76, 1231 (2000).

(Continued)

Primary Examiner—Walter L Lindsay, Jr.
Assistant Examiner—Reema Patel
(74) Attorney, Agent, or Firm—Law Office of Gerald Maliszewski; Gerald Maliszewski

(57) ABSTRACT

A germanium (Ge) short wavelength infrared (SWIR) imager and associated fabrication process are provided. The imager comprises a silicon (Si) substrate with doped wells. An array of pin diodes is formed in a relaxed Ge-containing film overlying the Si substrate, each pin diode having a flip-chip interface. There is a Ge/Si interface, and a doped Ge-containing buffer interposed between the Ge-containing film and the Ge/Si interface. An array of Si CMOS readout circuits is bonded to the flip-chip interfaces. Each readout circuit has a zero volt diode bias interface.

7 Claims, 6 Drawing Sheets

OTHER PUBLICATIONS

S. Famà, L. Colace, G. Masini, G. Assanto, and H-C. Luan, "High performance germanium-on-silicon detectors for optical communications", Appl Phys Lett, vol. 81, 586 (2002).

J. Hartmann et al, "Reduced pressure-chemical vapor deposition of Ge thick layers on Si (001) for 1.3-1.55-µm photodetection" Journal of Applied Physics, vol. 95, 5905 (2004).

J. Liu, et al. "Tensile strained Ge p-i-n photodetectors on Si platform for C and L band telecommunications", Applied Physics Letters, vol. 87, 011110 (2005).

O.I. Dosunmu, D.D. Cannon. M.K. Emsley, L.C. Kimerling, and M.S. Unlu, "High-Speed Resonant Cavity Enhanced Ge Photdetectors on Reflecting Si Substrates for 1550-nm Operation", IEEE Photonics Technology Letters, vol. 17, 175 (2005).

* cited by examiner

GE SHORT WAVELENGTH INFRARED IMAGER

BACKGROUND OF THE INVENTION

1. Field of the Invention

This invention generally relates to integrated circuit (IC) and semiconductor processes and, more particularly, to a germanium (Ge) short wavelength infrared (SWIR) imager and associated fabrication process.

2. Description of the Related Art

Short wavelength infrared (SWIR) imagers, with about a 1 to 1.7 micron wavelength, are used in camera systems for military and security night vision applications, as well as in many machine vision applications. Most conventional SWIR light-sensitive components are made of InGaAs films epitaxially grown on InP substrates. Compared to Si substrates, InP substrates are small (only up to 4 inches in diameter), fragile, and very expensive.

By adjusting the relative In and Ga content, the lattice constant of InGaAs can be tailored to match the InP lattice constant, or be very close to it, thus minimizing threading dislocations and the accompanying increase in dark current. An array of diodes is typically formed in the InGaAs film, to form a focal plane array of pixels. Each diode is typically 25-40 microns square. The diodes may be isolated by trenches filled with dielectric, or by a guard-ring implant. Next, the two terminals of each InGaAs diode have indium contacts formed on them. The InGaAs/InP assembly with In contacts is then flip-chip bonded to a readout circuit typically fabricated using Si CMOS technology. To minimize the noise due to dark current, the readout circuit is often designed to keep the bias across each InGaAs diode at close to zero volts. A variety of circuits are used, but the best usually use op-amps in the interface. Since the InGaAs pixels are large (25 microns or more) this is not a problem for current Si CMOS technology. After flip-chip bonding, the incident SWIR light has to travel through the InP substrate to get to the InGaAs film. However, InP is mostly transparent at these wavelengths, so the light travels through the InP substrate without significant absorption and reaches the InGaAs film, where it is absorbed, turned into an electrical signal, and fed to the read-out circuit, from which it is turned into a digital image.

Therefore, the good SWIR absorption characteristics of InGaAs are combined with the reliability and low cost of Si CMOS readout circuits. However, due to the small size and fragility of available InP substrates, the cost of fabricating epitaxial InGaAs films on InP substrates is very high. This, in turn, keeps the cost of cameras based on these image sensors very expensive. Nevertheless, this technology has found good acceptance in high-end applications, such as night vision cameras for security and military use and machine vision cameras for inspecting products ranging from apples, to pharmaceuticals, to Si integrated circuits.

Due to the large lattice mismatch between Ge and Si (4.2%), it is not easy to obtain Ge films on Si with proper flatness and low defect density. However, in recent years a variety of methods have been developed to produce good quality Ge films on Si substrates. One early method uses the ultrahigh vacuum chemical vapor deposition (UHVCVD) growth of Ge on relaxed, graded SiGe buffer layers. This results in dark (leakage) currents in p-i-n diodes as low as 0.15 mA/cm$^2$ at 1V reverse bias, which is just a few times higher than the theoretical limit of ~0.05 mA/cm$^2$ for their device structure. However, this method requires a SiGe buffer over 10 microns thick and a CMP step to reduce surface roughness. Similar dark current results have recently been obtained with Ge on a 4 micron thick SiGe buffer grown using Sb surfactant-mediated MBE. Another technique is to first deposit Ge at ~350° C. and then at ~600° C. This two-step process results in micron-thick Ge films with smooth surfaces, without a CMP step. This method can be combined with the technique of cycle annealing to concentrate the threading dislocations near the Ge/Si interface, and so reduce the leakage currents. Using similar techniques, several groups have fabricated near-infrared Ge photodetectors for telecommunication applications. Typically, the dark current in these devices is 10-100 mA/cm$^2$ at 1 V reverse bias. We have also demonstrated the advantage of two-step growth followed by cycle annealing, achieving dark currents as low as 5 mA/cm$^2$ at 1V bias in 1.5-2 micron thick Ge films.

Two-step epi-Ge growth followed by cycle annealing can be used to fabricate back-side illuminated Ge photodetectors using SOI substrates. Si wafers are transparent to wavelengths longer than 1100 nm, so light between 1100 nm and 1600 nm, which is incident on the backside of the Si wafer, can travel through the wafer to be absorbed by the Ge film. The buried oxide (BOX), silicon-on-insulator (SOI), and Ge thicknesses can be chosen to produce a resonant cavity at the wavelength of interest, 1550 nm. In this way, the photodetection is enhanced.

An alternative to growing Ge directly on Si is to form a Ge film by using one of a variety of wafer bonding techniques. Nearly perfect bulk Ge wafers are now available in sizes up to six inches, but the wafers are more fragile than Si. The advantage is that these bonded Ge films should exhibit fewer defects and lower dark current. The disadvantage is that the method is limited by the size of available Ge wafers.

All of the above-mentioned techniques still produce Ge films which have higher leakage currents than epitaxial InGaAs/InP, since even perfect Ge has intrinsically higher leakage than perfect InGaAs. However, if operated at zero bias, the dark current of a diode is ideally zero. So, if Ge diodes can be operated at sufficiently close to zero volts, even imperfect, leaky material can be used to make imagers having noise low enough for many applications.

It would be advantageous to use a Ge film on Si substrate as a SWIR light-sensitive component, as Si substrates are large (currently up to 12 inches in diameter) and robust.

SUMMARY OF THE INVENTION

The present invention describes Ge diodes fabricated on a Si substrate and flip-chip bonded to a Si CMOS readout circuit designed to operate each diode at very close to zero volts, as an alternative solution to making SWIR imagers using InGaAs/InP. Since Si wafers are transparent to wavelengths longer than 1100 nm, light between 1100 nm and 1600 nm, which is incident on the backside of the Si wafer, can travel through the wafer to be absorbed by the Ge film.

Generally, one method for fabricating a Ge/Si photodetector focal plane array, flip-chip bonded to a Si read-out circuit, is described as follows. A low-defect Ge film on a Si substrate is prepared, using any state-of-the-art method. These methods include, but are not limited to, Ge on a graded SiGe buffer, two-step Ge epitaxy, cycle anneal, surfactant-mediated epitaxy, and Ge wafer bonding. The growth techniques include but are not limited to UHVCVD, reduced pressure CVD, and molecular beam evaporation (MBE).

An array of photodetectors is fabricated in the Ge film, typically p-i-n diodes, using any state-of-the-art process. The active region of the photodetectors is thick enough to absorb a significant proportion of the desired SWIR wavelength or wavelength range, typically about 5 microns thick. This thickness varies depending on the application. Also, since the final focal plane array (FPA) is backside-illuminated through the Si substrate, the active region of the Ge photodetector is located sufficiently close to the Si substrate. For example, if too thick of a graded SiGe buffer is used, much of the SWIR radiation may be absorbed in the buffer before it reaches the Ge photodetector. The optimum position of the Ge photodetector with respect to the Si substrate depends on the application.

A Si CMOS read-out circuit on Si wafers is prepared using any standard, state-of-the-art process. The pitch of the read-out circuit matches that of the Ge FPA, and the circuit design keeps the two terminals of each Ge photodetector at nearly zero relative bias, preferably less than 0.001V.

Using any state-of-the-art flip-chip bonding process, the Ge FPA is bonded to the Si CMOS read-out circuit. The fabrication of the back-side illuminated imager is completed using any state-of-the-art packaging and necessary low-noise amplifier and digital processing circuitry.

Accordingly, a germanium (Ge) short wavelength infrared (SWIR) imager is provided. The imager comprises a silicon (Si) substrate with doped wells. An array of pin diodes is formed in a relaxed Ge-containing film overlying the Si substrate, each pin diode having a flip-chip interface. There is a Ge/Si interface, and a doped Ge-containing buffer layer interposed between the Ge-containing film and the Ge/Si interface. An array of Si CMOS readout circuits is bonded to the flip-chip interfaces. Each readout circuit has a zero volt diode bias interface.

The doped Ge-containing buffer layer is substantially transparent to light having a wavelength in the range of about 1100 nanometers (nm) to 1600 nm, and has a thickness of less than about 0.25 microns. Likewise, in the array of pin diodes, each diode includes an active region formed with a thickness sufficient to absorb light having a wavelength in the range of about 1100 nm to 1600 nm, which is typically in the range of about 1 to 5 microns. The diodes in the array each include an isolated Ge intrinsic region with a boundary formed to the level of the doped Ge-containing buffer layer. The boundary is made from either an interlevel dielectric or a doped Ge-containing film.

In the array of Si CMOS readout circuits, each readout circuit includes a diode interface with a bias of less than 0.001 volts. Typically, each readout circuit includes an operational amplifier with two inputs and an open circuit gain of greater than about 10,000, where the diode interface is formed across the operational amplifier inputs, forming a diode bias voltage inversely proportional to the operational amplifier open circuit gain.

Additional details of the above-described imager and imager fabrication process are presented below.

DETAILED DESCRIPTION

Figure 1:
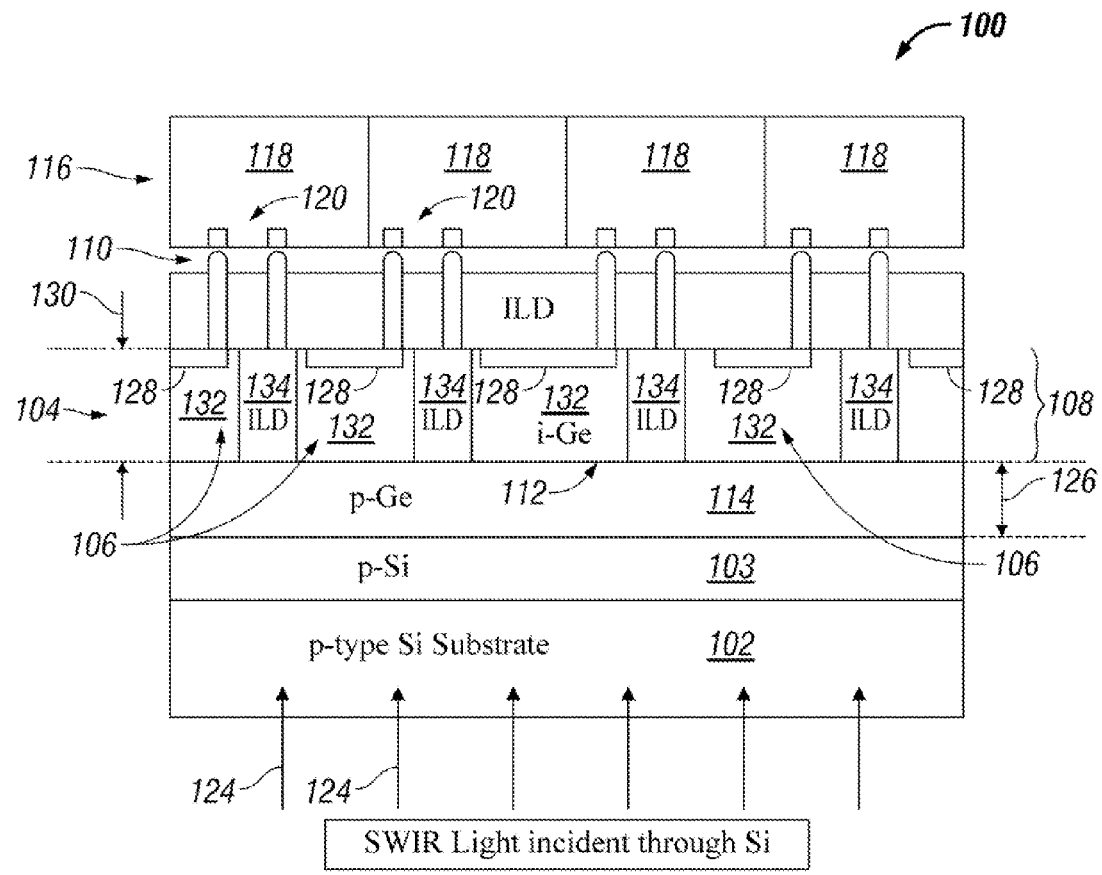
FIG. 1 is a partial cross-sectional view of a germanium (Ge) short wavelength infrared (SWIR) imager.

FIG. 1 is a partial cross-sectional view of a germanium (Ge) short wavelength infrared (SWIR) imager. The imager 100 comprises a silicon (Si) substrate 102 with doped wells 103. Here, a p-type Si substrate 102 is shown with a single p-doped well 103 for simplicity. But it should be understood that a substrate may be made up of a plurality of wells. Likewise, a doping design based upon a p-type substrate is shown, but it should be understood that an equivalent design could be enabled with an n-type substrate (or large n-doped well in a p-substrate).

An array 104 of pin diodes 106 is formed in a relaxed Ge-containing film 108 overlying the Si substrate 102. For example, the Ge-containing film 108 may be Ge, SiGe, or graded SiGe. Each pin diode 106 has a flip-chip interface 110. Only a row of 4 diodes 106 is shown in the figure, however, it should be understood that the array may include any large number of diodes arranged in a matrix of rows and column.

A Ge/Si interface 112 is shown, with a doped Ge-containing buffer layer 114 interposed between the Ge-containing film 108 and the Ge/Si interface 112. If the substrate 102 is p-type, the Ge-containing buffer is p-doped. An array 116 of Si CMOS readout circuits 118 is bonded to the flip-chip interfaces 110. Each readout circuit 118 has about a zero volt diode bias interface 120. More specifically, the Si CMOS readout diode interface 120 typically has a bias of less than 0.001 volts.

Figure 2:
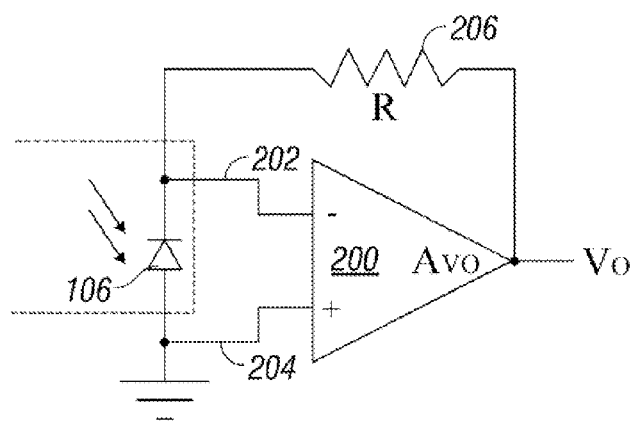
FIG. 2 is a schematic diagram of an exemplary Si CMOS readout circuit diode interface.

FIG. 2 is a schematic diagram of an exemplary Si CMOS readout circuit diode interface. As shown, the Si CMOS readout circuit 118 includes an operational amplifier 200 with two inputs, 202 and 204, and an open circuit gain of greater than about 10,000, The diode interface is formed across the operational amplifier inputs 202 and 204, forming a diode bias voltage inversely proportional to the operational amplifier open circuit gain.

Returning to FIG. 1, the Si substrate 102 is transparent to a broad spectrum of light wavelengths. The doped Ge-containing buffer layer 114 is transparent to light, represented here with reference designator 124, having a wavelength in the range of about 1100 nanometers (nm) to 1600 nm. Typically, the doped Ge-containing buffer layer 114 transmits more than about 75% of incident light 124, as a result of the Ge-containing buffer layer having a thickness 126 of less than about 0.25 microns.

In contrast, each diode 106 includes an active region 132 formed with a thickness 130 sufficient to absorb light 124 having a wavelength in the range of about 1100 nm to 1600 nm. Typically, the pin diode active region thickness 130 is in the range of about 1 to 5 microns. The region 128 is the N+ Ge part of the p-i-n diode. The thickness of the N+ Ge region 128 is not especially critical, but is typically 0.05 to 0.4 microns.

Each pin diode 106 includes an isolated Ge intrinsic region 132 with a boundary 134 formed to the level of the doped Ge-containing buffer layer 114. As shown in FIG. 1, the boundary 134 is made from a conventional interlayer dielectric.

Figure 3:
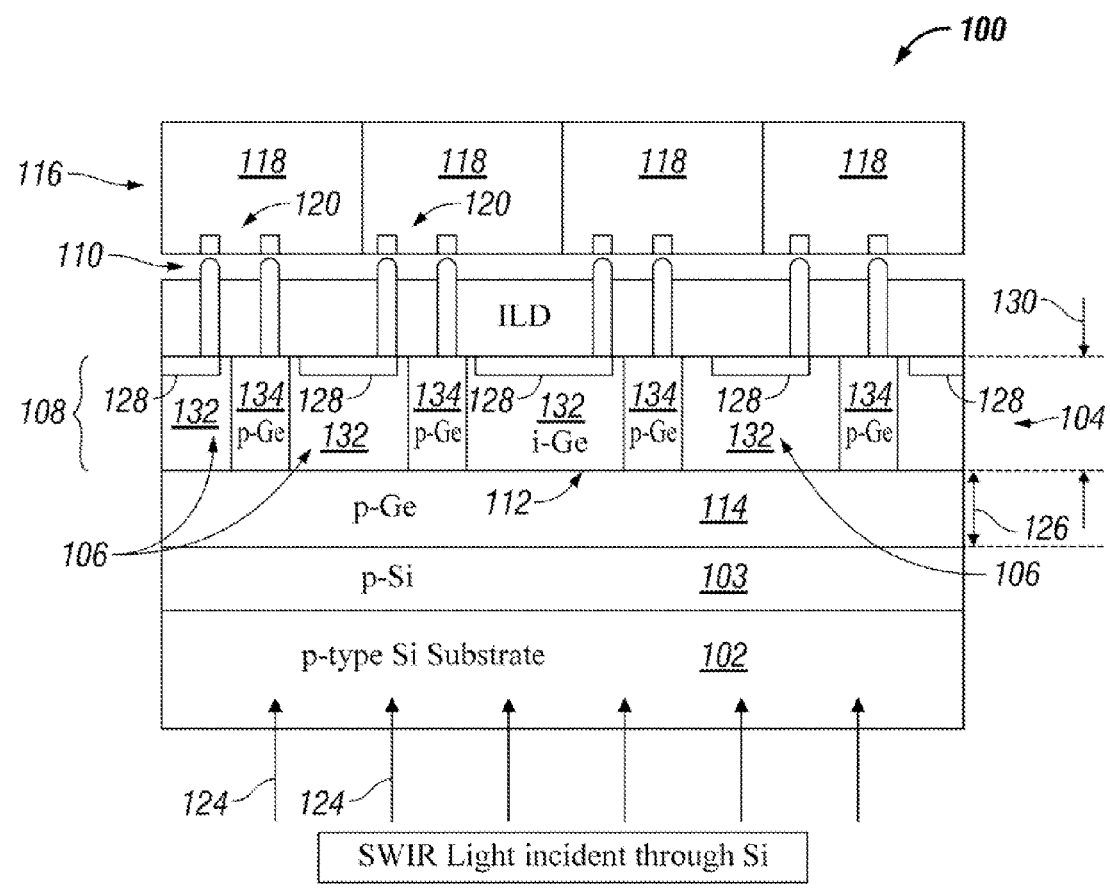
FIG. 3 is a partial cross-sectional view of a variation of the Ge imager of FIG. 1.
Figure 4:
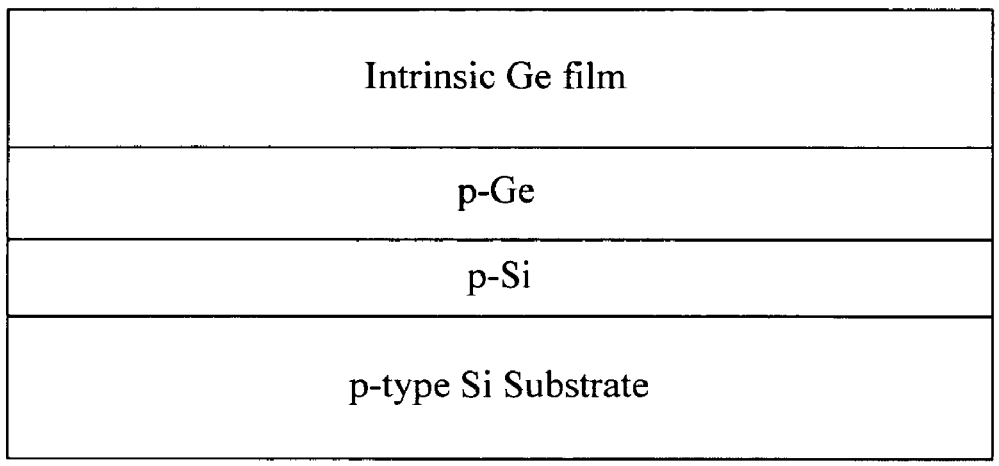
FIGS. 4 through 7 depict steps in the completion of a Ge SWIR imager, using a specific exemplary fabrication process.

FIG. 3 is a partial cross-sectional view of a variation of the Ge imager of FIG. 1. In this variation, the boundary 134 surrounding the Ge intrinsic region 132 is a doped Ge-containing film. If the substrate 102 is p-type Si, the guard ring boundary 134 is p-doped.

Functional Description

The general steps for fabricating a Ge/Si photodetector focal plane array, flip-chip bonded to a Si read-out circuit, are described as follows. A low-defect Ge film is prepared on a Si substrate, using any state-of-the-art method. These methods include, but are not limited to Ge on a graded SiGe buffer, two-step Ge epitaxy, cycle anneal, surfactant-mediated epitaxy, and Ge wafer bonding. Some exemplary growth techniques include, but are not limited to, UHVCVD, reduced pressure CVD, and MBE.

An array of photodetectors is fabricated in the Ge film, typically p-i-n diodes, using any state-of-the-art process. The active region of the photodetectors is thick enough to absorb a significant proportion of the desired SWIR wavelength or wavelength range, typically about 5 microns thick. The exact thickness varies depending on the application. Also, since the final FPA is backside illuminated through the Si substrate, the active region of the Ge photodetector is located sufficiently close to the Si substrate. If the graded SiGe buffer is too thick, much of the SWIR radiation is absorbed in the buffer before it reaches the Ge photodetector. The optimum position of the Ge photodetector with respect to the Si substrate depends upon the application.

A Si CMOS read-out circuit on a Si wafer is prepared using any standard, state-of-the-art process. The pitch (distance between pixels) of the read-out circuit matches that of the Ge FPA. The readout circuit is designed to keep the two terminals of each Ge photodetector at nearly zero relative bias, preferably less than 0.001V.

Using any state-of-the-art flip-chip bonding process, the Ge FPA is bonded to the Si CMOS read-out circuit. The fabrication of the back-side illuminated imager is completed using any state-of-the-art packaging process.

FIGS. 4 through 7 depict steps in the completion of a Ge SWIR imager, using a specific exemplary fabrication process. Viewing FIG. 4, p-wells in a p-type Si substrate are formed by boron implantation. For example, boron may be implanted with an energy of 100 keV and a dosage of $5e13/cm^2$, with a second implantation using 35 keV and $2e14/cm^2$ boron, followed by an activation/diffusion anneal, such as 1000° C. for 30 minutes.

The implanted Si wafer is prepared for Ge deposition with standard RCA cleaning followed by a DHF dip and rinse/dry cycle. In this example, CVD techniques are used to grow an epitaxial Ge film using a two-step process. Ge is first deposited at a low temperature, around 250°-300° C., to form a continuous, thin Ge layer, about 100 nm thick. Then, the temperature is raised to about 600-700° C. to grow the rest of the Ge film. The result is a relaxed, epitaxial Ge film, from about 0.5 microns to several microns thick. Additional details of this process can be found in U.S. Pat. No. 7,037,856, entitled, METHOD OF FABRICATING A LOW-DEFECT STRAINED EPITAXIAL GERMANIUM FILM ON SILICON, invented by Jer-shen Maa et al., owned by the same assignees as the instant application, and which is incorporated herein by reference. A buffer Si layer can also be deposited before the first Ge deposition step. If desired, the Si buffer and initial Ge film can be in-situ doped p-type, e.g. with boron, during growth. Most of the Ge film is not intentionally doped, and a nominally intrinsic layer is formed.

Figure 5:
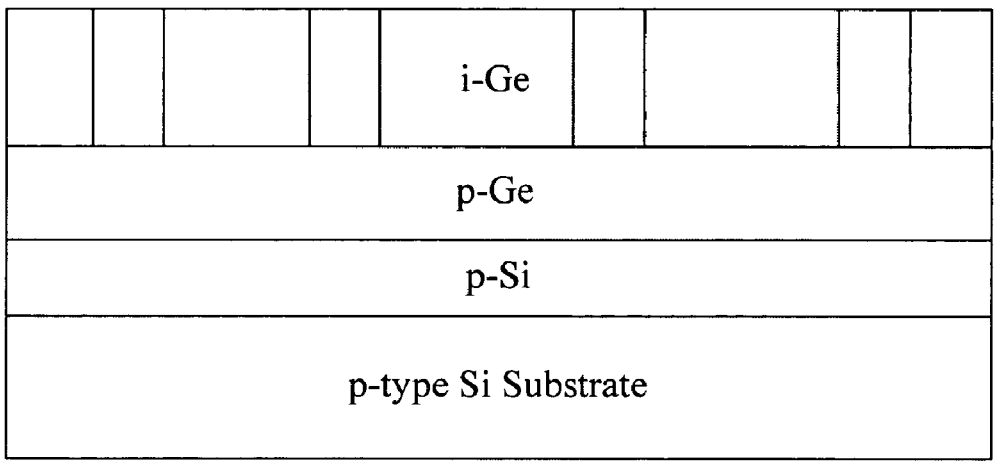

In FIG. 5, an array of diodes may be defined by etching Ge mesas, stopping at the Si substrate. Alternatively, if guard-ring implants are used to define the diodes, as shown, no etching is done.

The Ge surface is next covered with a thin protective layer, e.g. of $Si_3N_4$ deposited by PECVD, and the wafer is cycle annealed in an inert ambient. Specifically, the wafer is annealed at a low temperature followed by a high temperature, and this cycle is repeated a number of times. Due to cycle annealing of the Ge film, threading dislocations are driven to the region near the Ge/Si interface. The upper temperature of the cycle is between 840-920° C., and the lower temperature of the anneal cycle is between 700-840° C. The number of cycles is between 5 to 40 with a duration of 1-10 min for each cycle. The cycle anneal may also be followed by an anneal at a fixed temperature, such as at 740° C. for 10-60 minutes. After annealing, the protective capping layer (e.g. $Si_3N_4$) is carefully removed. For the case of $Si_3N_4$, a hot phosphoric etch can be used, but care must be taken to not damage the Ge surface.

At this point, the region near the Ge/Si interface is heavily defected. To prevent these defects from contributing to the leakage current in the final photodiode, a deep boron implant can be done to increase the dopant density in this region. For example, $4e12/cm^2$ boron can be implanted at 400-1000 keV.

If a guard ring structure is to be used to define and isolate the diode array, as shown, the diode regions are covered and patterned with photoresist, and the area between the diodes implanted with boron. For example, three implants can be done: a) 200 keV (energy) and $3e12/cm^2$ (dose), b) 90 keV and $3e12/cm^2$, and c) 25 keV and $2e15/cm^2$. These implants, coupled with the 400 keV and $4e12/cm^2$ deep boron implants described above, provide isolation to about a 1-micron depth. The energies and number of implants may vary depending on the thickness of the Ge film and desired active depth.

Figure 6:
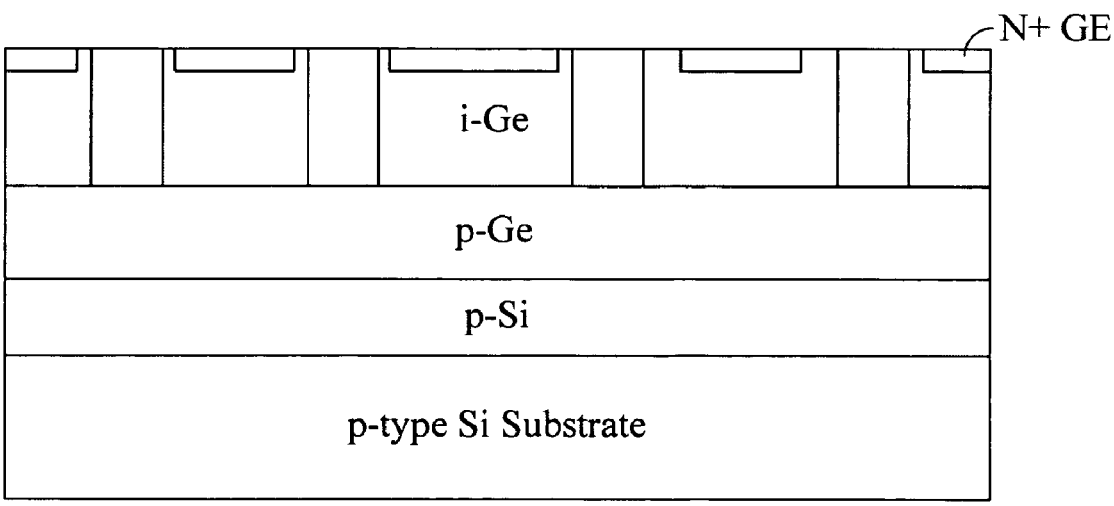

In FIG. 6, the diode top N+ Ge regions are formed. These doped Ge regions can be formed by patterning with photoresist and implanting phosphorous or arsenic at low energies (e.g. 25 keV and $2e15/cm^2$ arsenic). Alternatively, the surface may be covered with a thin TEOS oxide layer, patterned with photoresist, and a buffered oxide etch (BOE) used to etch openings in the TEOS. After which the photoresist is removed, epitaxial Ge is selectively grown, and selective in-situ phosphorous or arsenic doping is performed. In either case, the N+ Ge region is usually fairly thin, typically 50-400 nm thick.

If deep boron implants, a guard-ring structure, or N+ implants were performed, then a dopant activation is still required. The wafer is then covered with an interlayer dielectric, such as TEOS, and activated. Boron, arsenic, and phosphorous in Ge can be activated at lower temperatures than is possible in a Si substrate. For example, both boron and arsenic can be activated simultaneously by an anneal at 600° C. for only 4 minutes. A variety of other activation conditions can be used, but care must be taken to keep the thermal budget as low as possible, since arsenic and phosphorous diffuse much more rapidly in Ge than in Si. Boron, on the other hand, has similar diffusivities in both Ge and Si.

If, on the other hand, no such implants were performed, e.g. a Ge mesa structure with in-situ N+ doped epi Ge forms the top cathode, then no further dopant activation is required.

Figure 7:
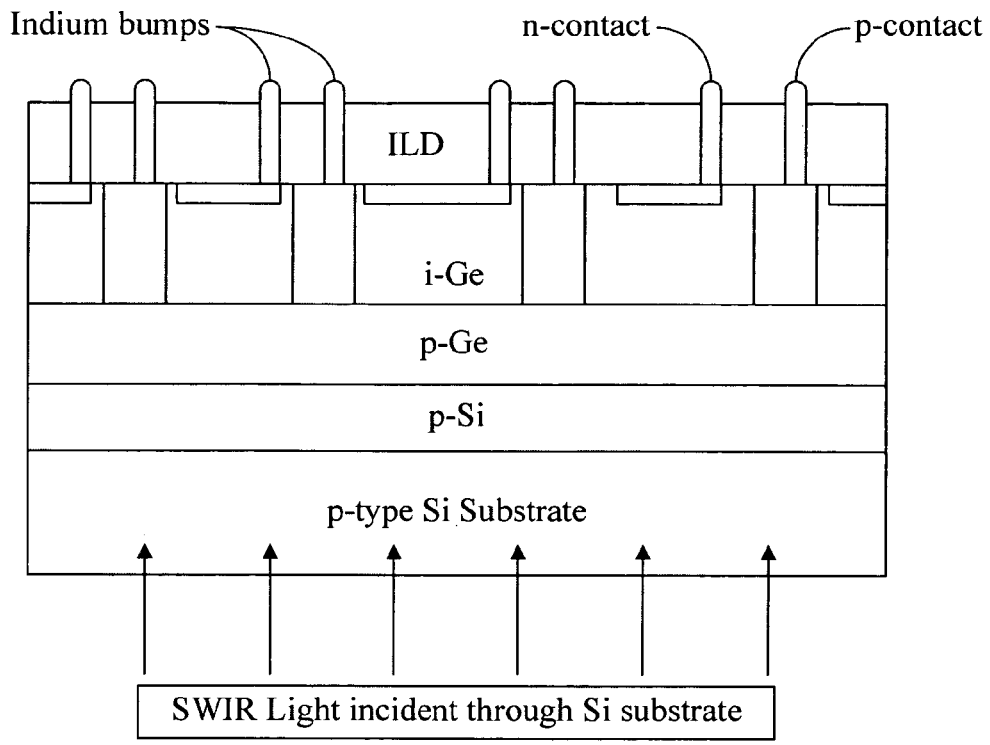

In FIG. 7, interlevel dielectric (ILD) deposition and metallization of the wafer is performed to complete fabrication of the focal plane array of diodes. This is followed by formation of indium bumps to be used in the flip-chip bonding process.

Figure 8:
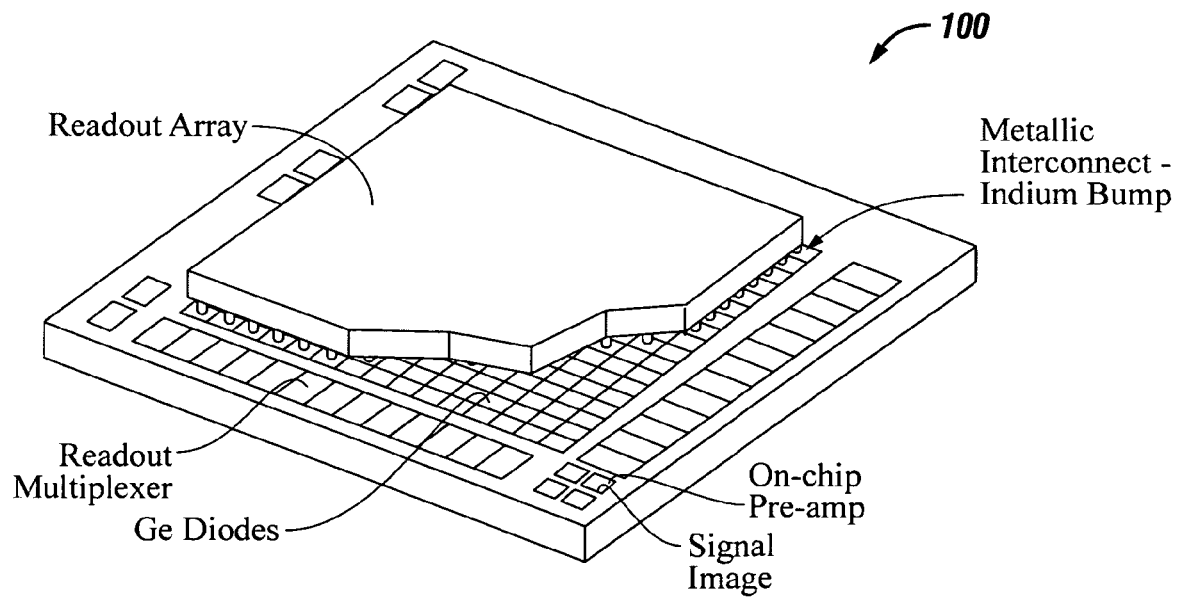
FIG. 8 depicts a perspective view of a completed focal plane array.

FIG. 8 depicts a perspective view of a completed focal plane array. The Si CMOS read-out circuit is prepared, and the Ge focal plane array is flip-chip bonded to it.

Concerning the technical feasibility of fabricating useful SWIR imagers with this Ge technology, several points can be made. Flip-chip construction is common in commercial SWIR cameras using InGaAs grown on InP substrates, since InP is mostly transparent at these wavelengths, although sometimes thinning of the InP is done. With this geometry applied to the Ge/Si case, the SWIR light has to come from the backside through the Si substrate.

Figure 9:
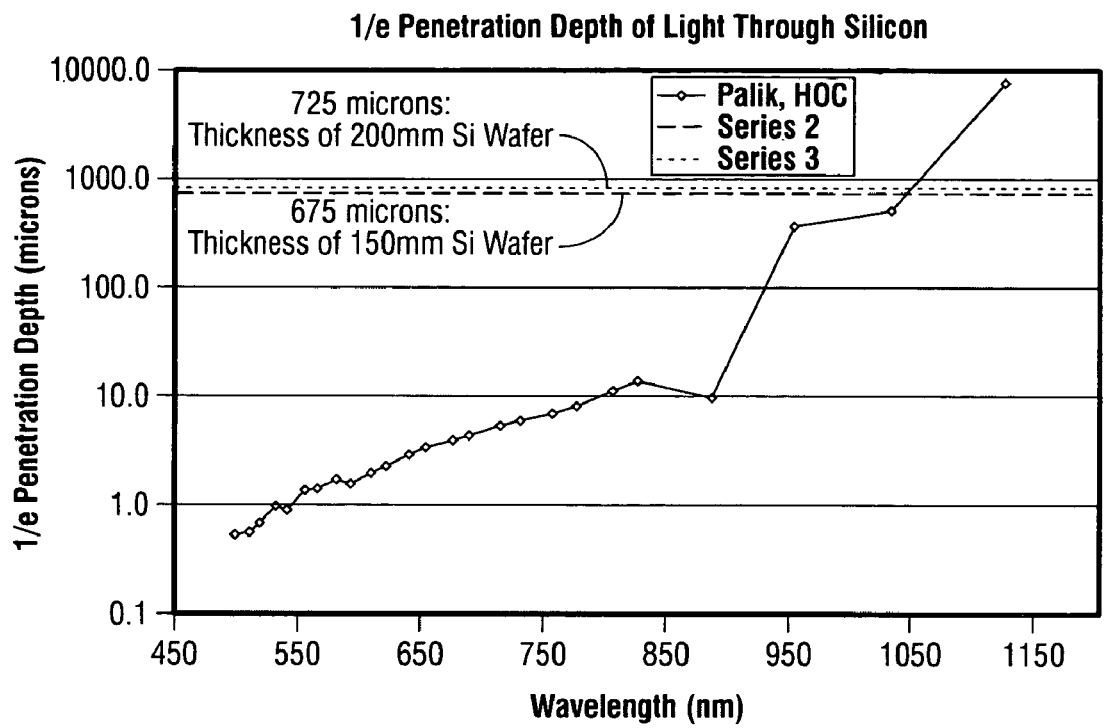
FIG. 9 plots the 1/e penetration depth of light through silicon as a function of wavelength.

FIG. 9 plots the 1/e penetration depth of light through silicon as a function of wavelength. It can be seen that light with a wavelength less than 1050 nm is mostly absorbed by standard silicon wafers. However, light beyond 1050 nm easily penetrates the silicon substrate to be absorbed by the Ge film on the other side. This data is taken from the Handbook of Optical Constants, edited by Edward Palik, Academic Press (1985). If needed, thinning of the Si substrate after flip-chip bonding is possible.

Figure 10:
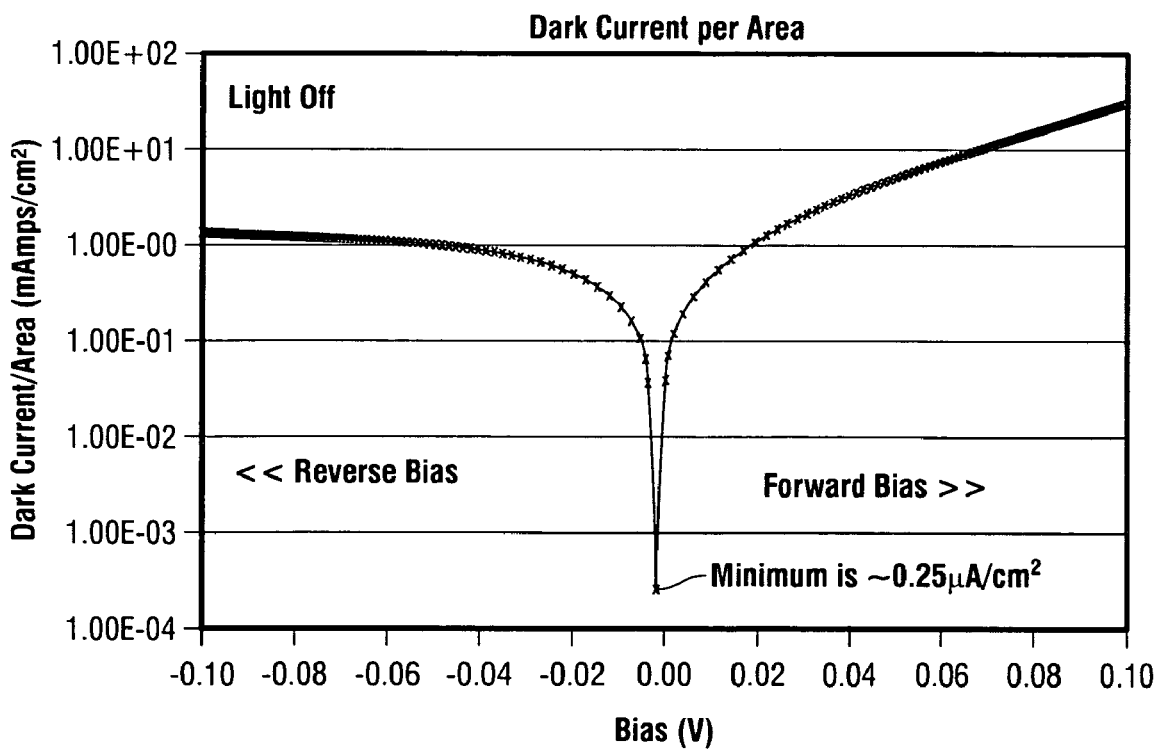
FIG. 10 is a diagram plotting dark current/area vs. bias for a Ge/Si diode made using the present invention methods.

FIG. 10 is a diagram plotting dark current/area vs. bias for a Ge/Si diode made using the present invention methods. Commercially available InGaAs/InP based SWIR imagers typically have zero bias dark currents as low as 10-30 nA/cm$^2$. Shown is a 27 micron square, 2 micron thick Ge p-i-n diode. It was cycle-annealed, and received both deep boron and guard ring boron implants. The cathode was formed using arsenic implantation. Implants were activated with a 600° anneal for 4 minutes. Shown is an I-V of dark current/area taken in 0.001 V steps. At 1.0V reverse bias (not shown) this diode exhibits 5.3 mA/cm$^2$ leakage, but near zero bias the dark current is ~0.25 micro-amp/cm$^2$, a decrease of more than 4 orders of magnitude. This dark current is about ten times that of the commercial InGaAs/InP cameras, giving about three times higher noise. Yet, for many applications this amount of noise can be tolerated, especially if a SWIR illumination source is used.

To keep the dark current to a minimum, the bias across each photodiode should be as close to zero as possible. FIG. 10 suggests that a bias of 0.001V, or less is sufficient. This requires the right Si CMOS readout circuit, of which there are many available.

Returning to FIG. 2, the initial amplifier portion of a readout circuit is shown. Shown is an operational amplifier 200 with high open circuit gain. Typically, the open circuit voltage gain of the amplifier is larger than 10,000. The feedback resistor 206 is selected depending on the minimum dark current of the photodetector and the minimum output voltage desired. For example, if the minimum dark current is $I_{LMIN}$ and the minimum output voltage is $V_{OMIN}$, then the feedback resistor is given by:

$$R = \frac{V_{OMIN}}{I_{LMIN}}. \quad (1)$$

Since this amplifier may be used for different types of photodetectors, the selection of the resistance value for the feedback resistor given by equation (1) cannot meet all applications. The resistance value of equation (1) only provides a general feedback resistance selection guide.

The photodiode bias voltage is $$V_{BIAS} = \frac{V_O}{A_{VO}} = \frac{RI_L}{A_{VO}} \quad (2)$$

The photodiode bias voltage is inversely proportional to the open circuit voltage gain of the operational amplifier.

Figure 11:
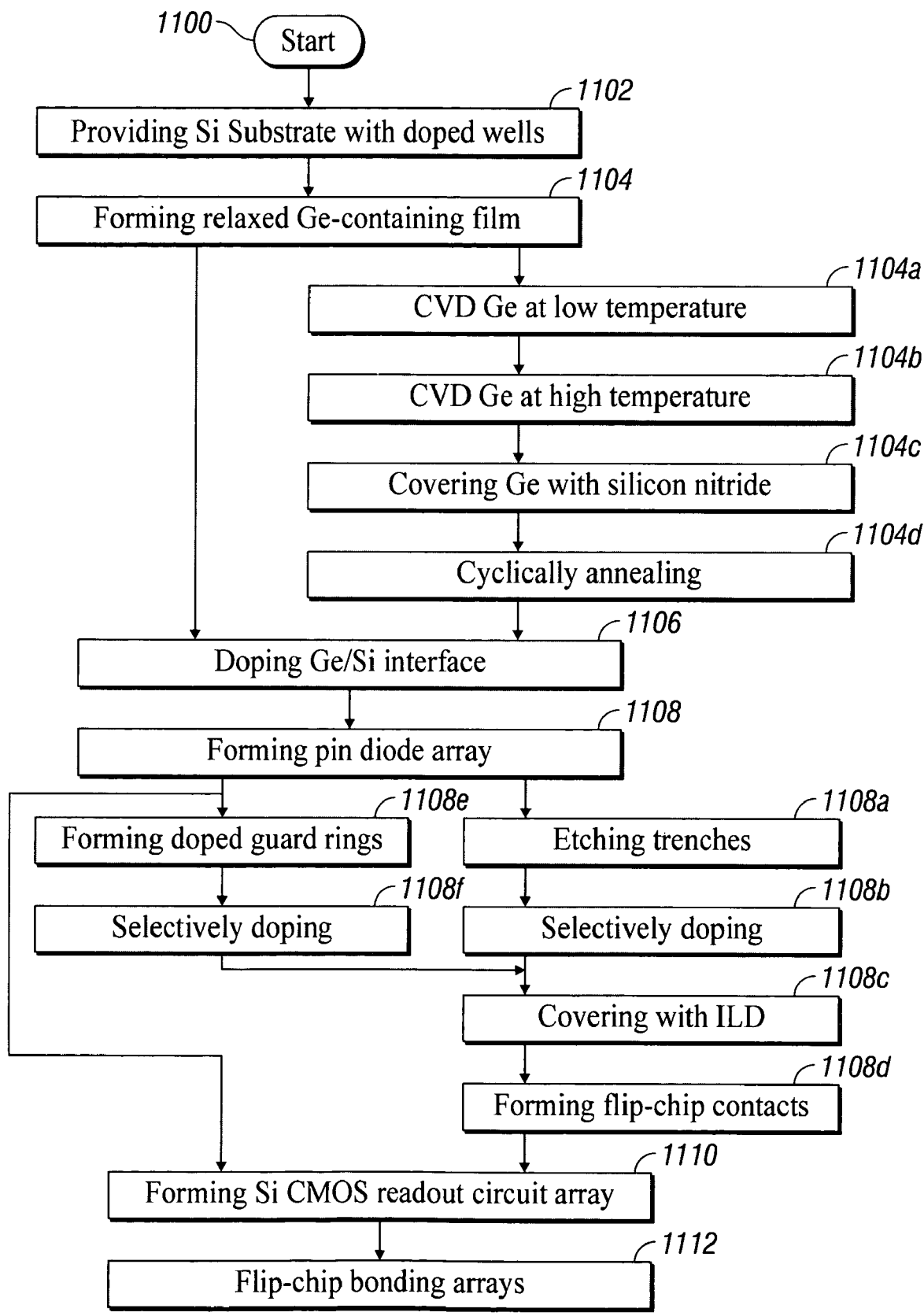
FIG. 11 is a flowchart illustrating a method for fabricating a Ge SWIR imager.

FIG. 11 is a flowchart illustrating a method for fabricating a Ge SWIR imager. Although the method is depicted as a sequence of numbered steps for clarity, the numbering does not necessarily dictate the order of the steps. It should be understood that some of these steps may be skipped, performed in parallel, or performed without the requirement of maintaining a strict order of sequence. The method starts at Step 1100.

Step 1102 provides a Si substrate with doped wells. Step 1104 forms a relaxed Ge-containing film with threading dislocations at a Ge/Si interface. Step 1106 dopes the Ge/Si interface. Step 1108 forms an array of pin diodes with flip-chip interfaces in the Ge-containing film. Step 1110 forms an array of Si CMOS readout circuits, each readout circuit having a zero volt diode bias interface. Step 1112 flip-chip bonds the array of pin diode interfaces to the array of readout circuit interfaces.

In one aspect, doping the Ge/Si interface in Step 1106 includes forming a doped Ge-containing buffer layer sufficiently thin to be transparent to incident light passing from the Si substrate to the array of pin diodes. Typically, Step 1106 forms the doped Ge-containing buffer layer so as to be transparent to light having a wavelength in the range of about 1100 nm to 1600 nm. For example, the doped Ge-containing buffer layer may be transparent to more than about 75% of incident light, and have a thickness of less than about 0.25 microns.

In another aspect, forming the array of pin diodes in Step 1108 includes forming the diode arrays with active regions sufficiently thick to absorb incident light. Typically, the diode active regions absorb light having a wavelength in the range of about 1100 nm to 1600 nm, and have a thickness in the range of about 1 to 5 microns.

In one variation, forming the array of pin diodes in Step 1108 includes substeps. After forming the relaxed Ge-containing film, Step 1108a selectively etches trenches in the relaxed Ge-containing film, down to the level of the Si substrate, forming an array of isolated Ge intrinsic regions. Step 1108b selectively dopes surface regions of each Ge intrinsic region, forming doped surface regions. Step 1108c covers the Ge-containing film with an ILD, and Step 1108d forms flip-chip contacts through the ILD to the doped surface regions.

Alternately, after forming the relaxed Ge-containing buffer layer, Step 1108e forms doped guard rings in the relaxed Ge-containing film down to the level of the doped Ge-containing buffer layer, creating an array of isolated Ge intrinsic regions. Step 1108f selectively dopes surface regions of each Ge intrinsic region, forming doped surface regions. Step 1108c covers the Ge-containing film with an ILD, and Step 1108d forms flip-chip contacts through the ILD to the doped surface regions.

In a different aspect, forming the array of Si CMOS readout circuits in Step 1110 includes forming readout circuits having a diode interface with a bias of less than 0.001 volts.

In one aspect, forming the relaxed Ge-containing film in Step 1104 includes substeps. Using a CVD process, Step 1104a deposits a first layer of Ge-containing film at a temperature in a range of about 250 to 300° C. Step 1104b CVD deposits a second layer of Ge-containing film, overlying the first layer, at a temperature in a range of about 600 to 700° C. Step 1104c covers the Ge-containing film with a silicon nitride layer, and Step 1104d cyclically anneals. As mentioned above, details of this process can be found in U.S. Pat. No. 7,073,856.

A Ge SWIR imager and associated fabrication process have been presented. Portions of the device and fabrication process can be practiced using conventional methods, and the invention is not limited to any of these mentioned processes. Further, process details and specific structures have been presented to illustrate the invention, but again, the invention is not limited to just these examples. Other variations and embodiments of the invention will occur to those skilled in the art.

We claim:

1. A method for fabricating a germanium (Ge) short wavelength infrared (SWIR) imager, the method comprising:
    providing a silicon (Si) substrate with doped wells;
    forming a relaxed Ge-containing film with threading dislocations at a Ge/Si interface;
    doping the Ge/Si interface, forming a doped Ge-containing buffer layer;
    forming an array of pin diodes with flip-chip interfaces in the Ge-containing film;
    forming an array of Si CMOS readout circuits, each readout circuit having a zero volt diode bias interface; and,
    flip-chip bonding the array of pin diode interfaces to the array of readout circuit interfaces.

2. The method of claim 1 wherein forming the array of pin diodes includes forming the diode arrays with active regions sufficiently thick to absorb incident light.

3. The method of claim 2 wherein forming the diode arrays with active regions sufficiently thick to absorb incident light includes forming a thickness sufficient to absorb light having a wavelength in the range of about 1100 nm to 1600 nm.

4. The method of claim 3 wherein forming the diode arrays with active regions sufficiently thick to absorb incident light includes forming an active region with a thickness in the range of about 1 to 5 microns.

5. The method of claim 1 wherein forming the array of Si CMOS readout circuits includes forming readout circuits having a diode interface with a bias of less than 0.001 volts.

6. The method of claim 1 wherein forming the array of pin diodes includes:
    after forming the relaxed Ge-containing buffer layer, forming doped guard rings in the relaxed Ge-containing film down to the level of the doped Ge-containing buffer layer, creating an array of isolated Ge intrinsic regions;
    selectively doping surface regions of each Ge intrinsic region, forming doped surface regions;
    covering the Ge-containing film with an ILD; and,
    forming flip-chip contacts through the ILD to the doped surface regions.

7. The method of claim 1 wherein forming the relaxed Ge-containing film includes:
    using a chemical vapor deposition (CVD) process, depositing a first layer of Ge-containing film at a temperature in a range of about 250 to 300° C.;
    CVD depositing a second layer of Ge-containing film, overlying the first layer, at a temperature in a range of about 600 to 700° C.;
    covering the Ge-containing film with a silicon nitride layer; and,
    cyclically annealing.

* * * * *